(12) United States Patent
Hu

(10) Patent No.: US 11,688,798 B2
(45) Date of Patent: Jun. 27, 2023

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Xiang Hu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 167 days.

(21) Appl. No.: 17/220,210

(22) Filed: Apr. 1, 2021

(65) Prior Publication Data
US 2021/0336031 A1 Oct. 28, 2021

(30) Foreign Application Priority Data

Apr. 26, 2020 (CN) .......................... 202010339107.4

(51) Int. Cl.
*H01L 29/66* (2006.01)
*H01L 21/8234* (2006.01)
*H01L 27/092* (2006.01)
*H01L 29/78* (2006.01)

(52) U.S. Cl.
CPC .. *H01L 29/6681* (2013.01); *H01L 21/823431* (2013.01); *H01L 27/0924* (2013.01); *H01L 29/7851* (2013.01)

(58) Field of Classification Search
CPC ............. H01L 29/6681; H01L 29/7851; H01L 21/823431; H01L 27/0924
See application file for complete search history.

(56) References Cited

U.S. PATENT DOCUMENTS

2021/0272893 A1* 9/2021 Song ................ H01L 21/76832

* cited by examiner

*Primary Examiner* — Christine A Enad
(74) *Attorney, Agent, or Firm* — Anova Law Group, PLLC

(57) ABSTRACT

A semiconductor structure and a method for forming the semiconductor structure are provided. The semiconductor structure includes a substrate including a first region and a second region, a first gate structure over the first region, and first source-drain doped layers in the first region of the substrate on both sides of the first gate structure. The semiconductor structure also includes a second gate structure over the second region, and second source-drain doped layers in the second region of the substrate on both sides of the second gate structure. Further, the semiconductor structure includes a first protection layer over the second gate structure, a first conductive structure over a first source-drain doped layer, and an isolation layer over the first conductive structure. The first conductive structure is also formed on the first gate structure, and the first conductive structure has a top surface lower than the first protection layer.

18 Claims, 5 Drawing Sheets

SEMICONDUCTOR STRUCTURE AND FABRICATION METHOD THEREOF

CROSS-REFERENCES TO RELATED APPLICATIONS

This application claims the priority of Chinese patent application No. 202010339107.4, filed on Apr. 26, 2020, the entirety of which is incorporated herein by reference.

FIELD OF THE DISCLOSURE

The present disclosure generally relates to the field of semiconductor manufacturing technology and, more particularly, relates to a semiconductor structure and a fabrication method thereof.

BACKGROUND

With the rapid development of semiconductor manufacturing technology, semiconductor devices have been developed towards higher component density and higher integration degree. For example, flash memory has been used as a storage device in electronic devices such as a digital camera, a notebook computer, or a tablet computer, etc. Therefore, reducing the size of the flash memory unit and thereby reducing the cost of the flash memory is one of directions of technological development. For a NOR gate tunneling oxide electrically erasable flash memory, a self-aligned contact process is used to fabricate a conductive structure on the surfaces of a source region and a drain region, which can meet the requirements of forming the flash memory with a substantially small size.

However, the performance of the existing semiconductor structure formed by the self-aligned contact process still needs to be improved. The disclosed methods and device structures are directed to solve one or more problems set forth above and other problems.

BRIEF SUMMARY OF THE DISCLOSURE

One aspect of the present disclosure includes a semiconductor structure. The semiconductor structure includes a substrate, a first gate structure and first source-drain doped layers. The substrate includes a first region and a second region adjacent to the first region. The first gate structure is formed over the first region, and the first source-drain doped layers are formed in the first region of the substrate on both sides of the first gate structure, respectively. The semiconductor structure also includes a second gate structure and second source-drain doped layers. The second gate structure is formed over the second region, and the second source-drain doped layers are formed in the second region of the substrate on both sides of the second gate structure, respectively. Moreover, the semiconductor structure includes a first protection layer formed over the second gate structure and a first conductive structure formed over a first source-drain doped layer of the source-drain doped layers. The first conductive structure is also formed on the first gate structure, and a top surface of the first conductive structure is lower than a top surface of the first protection layer. Further, the semiconductor structure includes an isolation layer formed over the first conductive structure.

Optionally, the semiconductor structure further includes a first dielectric layer formed over the substrate. The first dielectric layer covers the first gate structure, the second gate structure, the first source-drain doped layers, the second source-drain doped layers, the first protection layer, the first conductive structure, and the isolation layer. The first dielectric layer exposes top surfaces of the isolation layer and the first protection layer.

Optionally, the semiconductor structure further includes a second conductive structure formed over a second source-drain doped layer of the second source-drain doped layers, and a second protection layer formed over the second conductive structure. A top surface of the second conductive structure is lower than the top surface of the first protection layer. The first dielectric layer exposes a top surface of the second protection layer.

Optionally, the semiconductor structure further includes a second dielectric layer formed over the first dielectric layer, the isolation layer, the first protection layer, and the second protection layer.

Optionally, the semiconductor structure further includes a source-drain plug and a gate plug in the second dielectric layer. The second dielectric layer exposes top surfaces of the source-drain plug and the gate plug. The source-drain plug is extended into an inside of the first dielectric layer, and is in contact with a portion of the second conductive structure. The gate plug is extended into an inside of the first dielectric layer, and is in contact with a portion of the second gate structure.

Optionally, the substrate includes a base and a plurality of discrete fins formed on the base. The first gate structure is across a length portion of a fin of the plurality of discrete fins, and covers a portion of sidewall and top surfaces of the fin. The second gate structure is across a length portion of the fin, and covers a portion of sidewall and top surfaces of the fin.

Optionally, the first source-drain doped layers are formed in the fin, and the second source-drain doped layers are formed in the fin.

Optionally, the first gate structure includes a first gate dielectric layer and a first gate electrode layer formed over the first gate dielectric layer. The second gate structure includes a second gate dielectric layer and a second gate electrode layer formed over the second gate dielectric layer.

Optionally, the isolation layer is made of a material including silicon nitride.

Optionally, the first conductive structure is made of a material including a metal, and the metal includes tungsten, aluminum, copper, titanium, silver, gold, lead, nickel, or a combination thereof.

Optionally, the second conductive structure is made of a material including a metal, and the metal includes tungsten, aluminum, copper, titanium, silver, gold, lead, nickel, or a combination thereof.

Another aspect of the present disclosure includes a method for forming a semiconductor structure. The method includes a providing a substrate, and forming a first gate structure and first source-drain doped layers. The substrate includes a first region and a second region adjacent to the first region. The first gate structure is formed over the first region, and the first source-drain doped layers are formed in the first region of the substrate on both sides of the first gate structure, respectively. The method also includes forming a second gate structure and second source-drain doped layers. The second gate structure is formed over the second region, and the second source-drain doped layers are formed in the second region of the substrate on both sides of the second gate structure, respectively. Moreover, the method includes forming a first protection layer over the second gate structure, and forming a first conductive structure over a first source-drain doped layer of the first source-drain doped layers. The first conductive structure is also formed on the first gate structure, and a top surface of the first conductive structure is lower than a top surface of the first protection layer. Further, the method includes forming an isolation layer over the first conductive structure.

Optionally, the method further includes forming a first dielectric layer over the substrate. The first dielectric layer covers the first gate structure, the second gate structure, the first source-drain doped layers, the second source-drain doped layers, the first protection layer, the first conductive structure, and the isolation layer. The first dielectric layer exposes top surfaces of the isolation layer and the first protection layer.

Optionally, before forming the first conductive structure, the method further includes forming a third protection layer over the first gate structure.

Optionally, forming the first dielectric layer, the first gate structure, the second gate structure, the first protection layer, and the third protection layer includes: forming a first dummy gate structure and a second dummy gate structure over the substrate; forming the first dielectric layer over the substrate, where the first dielectric layer covers the first dummy gate structure and the second dummy gate structure, and exposes top surfaces of the first dummy gate structure and the second dummy gate structure; removing the first dummy gate structure and the second dummy gate structure, to form a first dummy gate opening and a second dummy gate opening in the first dielectric layer; forming the first gate structure in the first dummy gate opening; forming the second gate structure in the second dummy gate opening; back-etching the first gate structure and the second gate structure, to form a first gate groove on the first gate structure and a second gate groove on the second gate structure; and forming the third protection layer in the first gate groove and the first protection layer in the second gate groove.

Optionally, forming the first conductive structure and the isolation layer includes: forming a first source-drain conductive opening in the first dielectric layer, where the first source-drain conductive opening exposes a top surface of the first source-drain doped layer; forming a first gate conductive opening over the first gate structure by removing the third protection layer; forming an initial first conductive structure in the first gate conductive opening and the first source-drain conductive opening; forming the first conductive structure by back-etching the initial first conductive structure; and forming the isolation layer over the first conductive structure.

Optionally, the method further includes forming a second conductive structure over a second source-drain doped layer of the second source-drain doped layers, and forming a second protection layer over the second conductive structure. A top surface of the second conductive structure is lower than the top surface of the first protection layer. The first dielectric layer exposes a top surface of the second protection layer.

Optionally, the first conductive structure and the second conductive structure are simultaneously formed.

Optionally, the method further includes forming a second dielectric layer over the first dielectric layer, the isolation layer, the first protection layer, and the second protection layer.

Optionally, the method further includes forming a source-drain plug and a gate plug in the second dielectric layer. The second dielectric layer exposes top surfaces of the source-drain plug and the gate plug. The source-drain plug is extended into an inside of the first dielectric layer, and is in contact with a portion of the second conductive structure. The gate plug is extended into an inside of the first dielectric layer, and is in contact with a portion of the second gate structure.

The disclosed embodiments may have following beneficial effects. In the disclosed embodiments of the present disclosure, the isolation layer may be formed over the first conductive structure. The isolation layer may be configured to effectively reduce the short-circuit between the first conductive structure and any other device structure, thereby improving the electrical performance of ultimately formed semiconductor structure.

In addition, the top surface of the first conductive structure may be lower than the top surface of the first protection layer, such that a certain height difference may be formed between the first conductive structure and subsequently formed gate plug or source-drain plug, and the spacing between the first conductive structure and the gate plug or the source-drain plug may increase, thereby reducing the parasitic capacitance generated between the first conductive structure and the gate plug or the source-drain plug.

Further, the first source-drain conductive opening and the first gate conductive opening may be first formed. After forming the first gate conductive opening and the first source-drain conductive opening, the first conductive structure may be formed in the first source-drain conductive opening and the first gate conductive opening. Through such process, the first conductive structure may be simultaneously formed over the first gate structure and the first source-drain doped layer, which may effectively reduce the process steps and improve the production efficiency.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
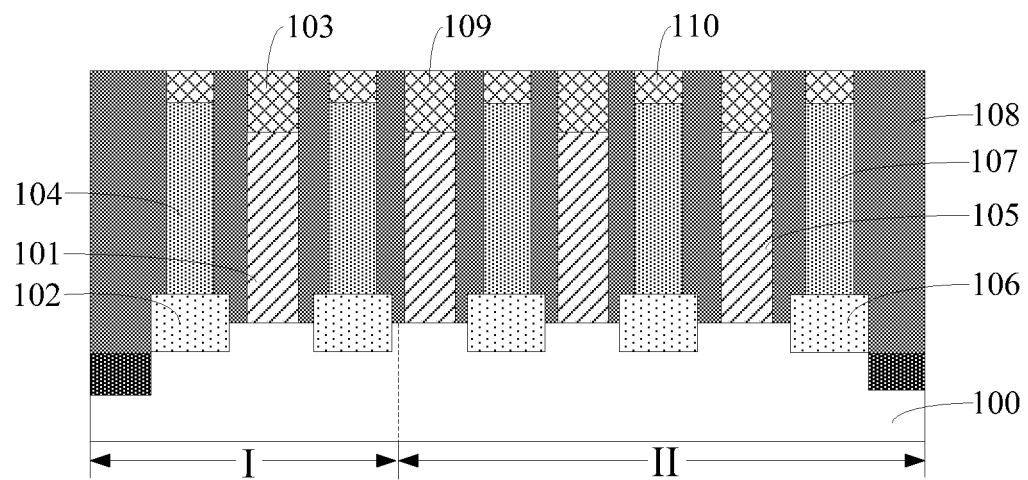
FIGS. 1-2 illustrate semiconductor structures corresponding to certain stages for forming a semiconductor structure.
Figure 2:
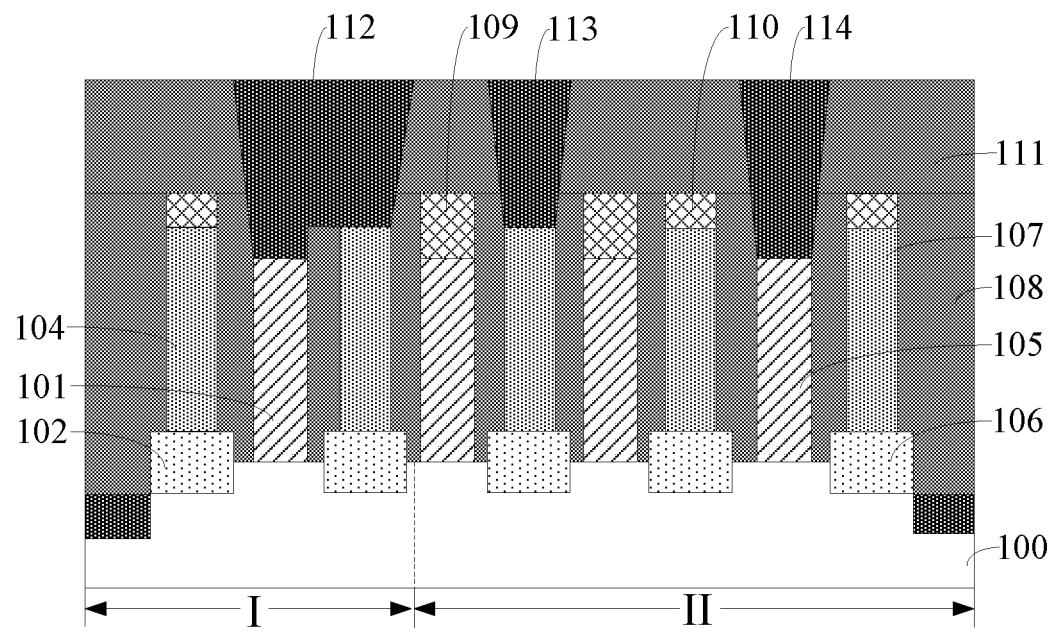

FIGS. 1-2 illustrate semiconductor structures corresponding to certain stages for forming a semiconductor structure. Referring to FIG. 1, a substrate 100 is provided, and the substrate 100 includes a first region I and a second region II. A first gate structure 101 is formed over the first region I, and a first protection layer 103 is formed over the first gate structure 101. A first source-drain doped layer 102 is formed in the first region I of the substrate, and the first source-drain doped layers 102 are located on both sides of the first gate structure 101. A first conductive structure 104 is formed over the first source-drain doped layers 102. A plurality of second gate structures 105 are formed over the second region II, and a second protection layer 109 is formed over the second gate structure 105. A plurality of second source-drain doped layers 106 are formed in the second region II, and a second source-drain doped layer 106 is located between adjacent second gate structures 105. A second conductive structure 107 is formed over the second source-drain doped layer 106, and a third protection layer 110 is formed over the second conductive structure 107.

A first dielectric layer 108 is formed over the substrate 100, and the first dielectric layer covers the first gate structure 101, the second gate structure 105, the first source-drain doped layer 102, the second source-drain doped layer 106, the first conductive structure 104, the second conductive structure 107, the first protection layer 103, the second protection layer 109, and the third protection layer 110. The first dielectric layer 108 exposes top surfaces of the first conductive structure 104, the second conductive structure 107, the first protection layer 103, the second protection layer 109 and the third protection layer 110.

Referring to FIG. 2, a second dielectric layer 111 is formed over the first dielectric layer 108, the first conductive structure 104, the second conductive structure 107, the first protection layer 103, the second protection layer 109, and the third protection layer 110. A conductive layer 112, a source-drain plug 113 and a gate plug 114 are formed in the second dielectric layer 111, and the second dielectric layer 111 exposes the top surfaces of the conductive layer 112, the source-drain plug 113 and the gate plug 114. The conductive layer 112 is extended into an inside of the first dielectric layer 108, and is in contact with the first gate structure 101 and the first conductive structure 104. The source-drain plug 113 is extended into an inside of the first dielectric layer 108, and is in contact with a portion of the second conductive structure 107. The gate plug 114 is extended into an inside of the first dielectric layer 108, and is in contact with a portion of the second gate structure 105.

In one embodiment, according to the design requirements of the electrical structure of the semiconductor structure, the first gate structure 101 needs to be electrically connected to the first conductive structure 104 through the conductive layer 112, and the conductive layer 112 is not connected with any other device structure.

However, the formed second dielectric layer 111 covers the conductive layer 112, the source-drain plug 113, and the gate plug 114, and the second dielectric layer 111 exposes the top surfaces of the conductive layer 112, the source-drain plug 113 and the gate plug 114. The semiconductor devices have been developed towards higher element density and higher integration degree, and, thus, the spacing between elements becomes smaller. Therefore, the spacing between the exposed conductive layer 112 and the source-drain plug 113 is substantially small. In the subsequent manufacturing process, the source-drain plug 113 needs to be electrically connected with other device structures. In such process, the formed device structure is also easily short-circuited with the conductive layer, thereby affecting the performance of the ultimately formed semiconductor structure.

Figure 12:
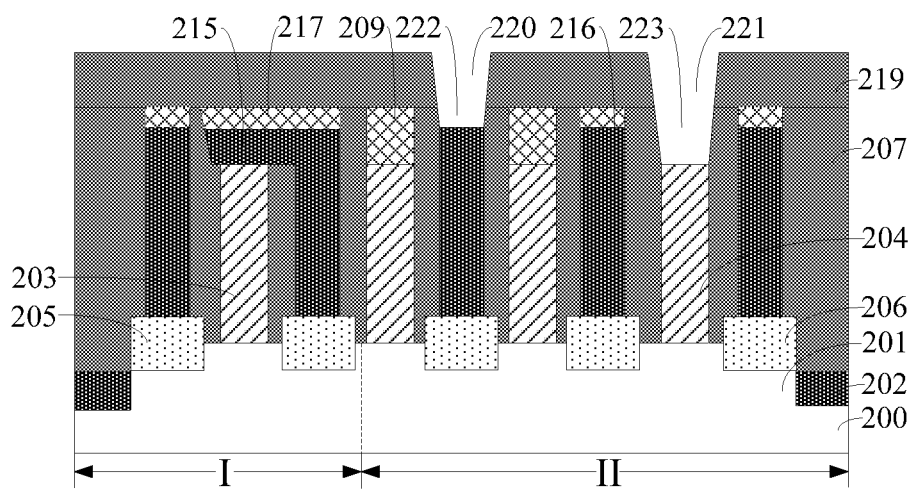
Figure 13:
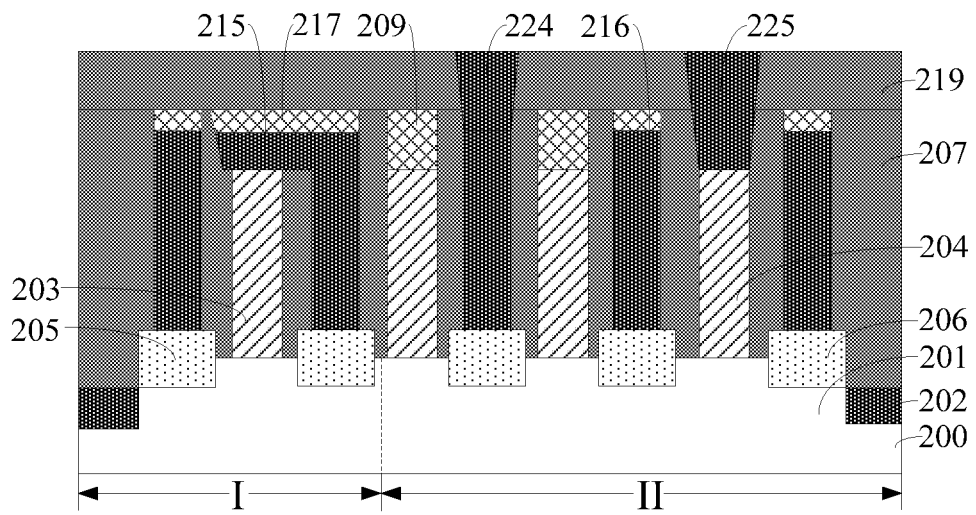
Figure 14:
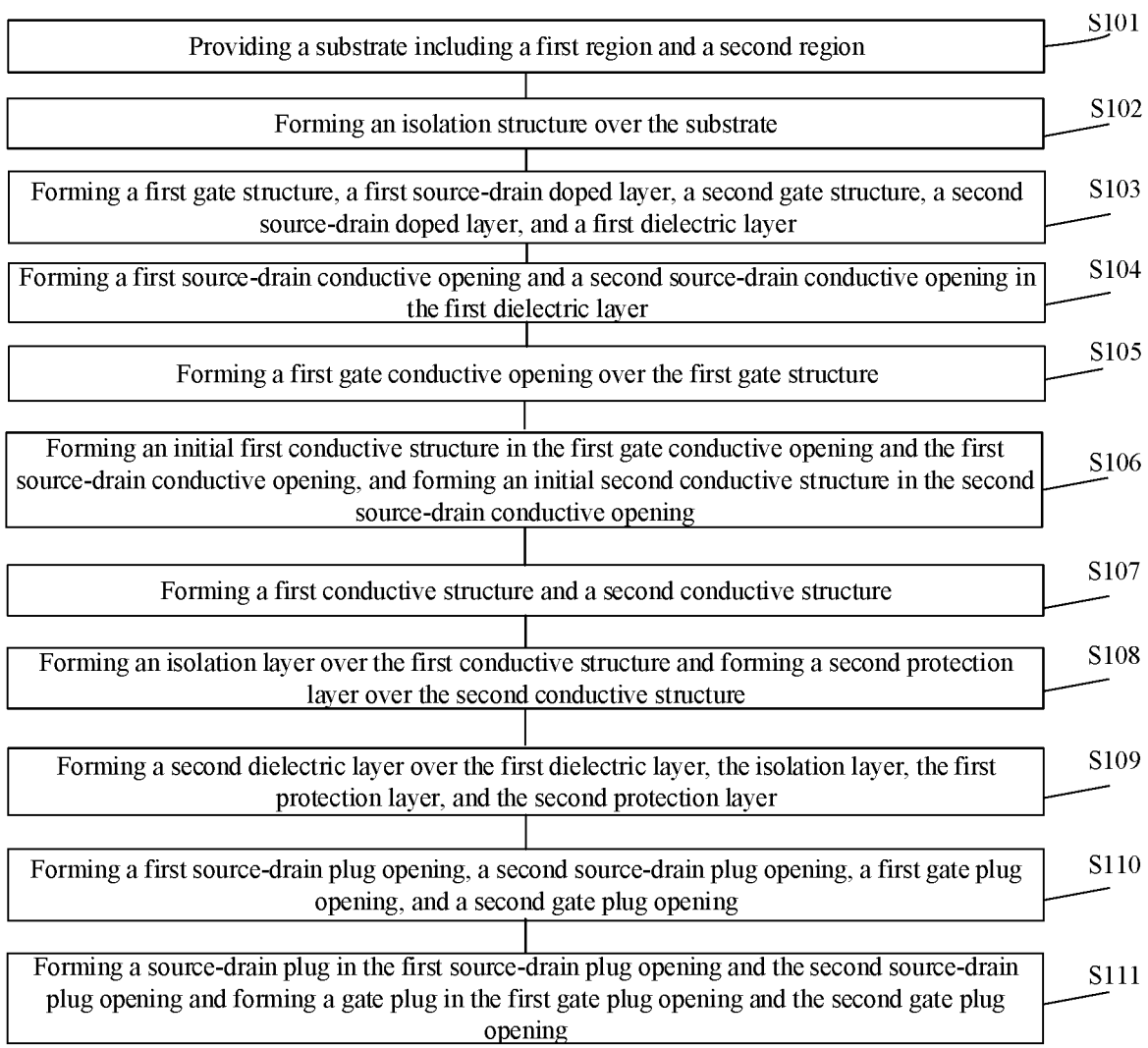
FIG. 14 illustrates a flowchart of an exemplary method for forming a semiconductor structure consistent with various disclosed embodiments of the present disclosure.

The present disclosure provides a semiconductor structure and a fabrication method thereof. FIG. 14 illustrates a flowchart of a method for forming a semiconductor structure consistent with various disclosed embodiments of the present disclosure, and FIGS. 3-13 illustrate semiconductor structures corresponding to certain stages of the fabrication method.

Figure 3:
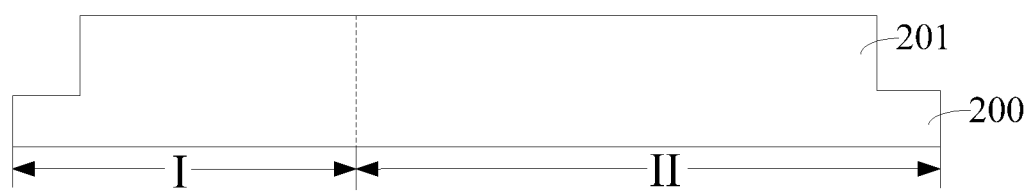
FIGS. 3-13 illustrate semiconductor structures corresponding to certain stages for forming an exemplary semiconductor structure consistent with various disclosed embodiments of the present disclosure.

As shown in FIG. 14, at the beginning of the fabrication method, a substrate including a first region and a second region may be provided (S101). FIG. 3 illustrates a corresponding semiconductor structure.

Referring to FIG. 3, a substrate may be provided. The substrate may include a first region I and a second region II. In one embodiment, the substrate may include a base 200 and a plurality of discrete fins 201 on the base 200.

In one embodiment, forming the base 200 and the plurality of fins 201 may include: providing an initial substrate (not illustrated), and forming a patterned layer on the initial substrate; etching the initial substrate using the patterned layer as a mask to form the base 200 and the plurality of fins 201.

In one embodiment, the base 200 may be made of monocrystalline silicon. In another embodiment, the base may be made of polysilicon or amorphous silicon. In certain embodiments, the substrate may be made of germanium, silicon germanium, gallium arsenide, or any other semiconductor material.

In one embodiment, the fin 201 may be made of monocrystalline silicon. In another embodiment, the fin may be made of monocrystalline silicon germanium, or any other semiconductor material. In certain embodiments, the substrate may not include the fin.

Figure 4:
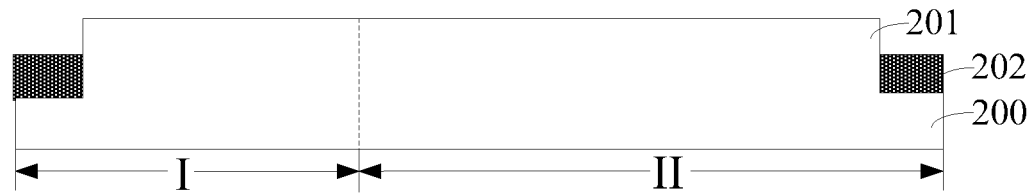

Returning to FIG. 14, after providing the substrate, an isolation structure may be formed over the substrate (S102). FIG. 4 illustrates a corresponding semiconductor structure.

Referring to FIG. 4, an isolation structure 202 may be formed over the substrate. In one embodiment, the isolation structure 202 may cover a portion of a sidewall of the fin 201, and a top surface of the isolation structure 202 may be lower than a top surface of the fin 201.

Forming the isolation structure 202 may include: forming an initial isolation structure (not illustrated) over the substrate, where the initial isolation structure may cover the fin 201; performing a planarization treatment on the initial isolation structure until the top surface of the fin 201 is exposed; and after performing the planarization treatment, removing a portion of the initial isolation structure to form the isolation structure 202. The top surface of the isolation structure 202 may be lower than the top surface of the fin 201.

In one embodiment, the process of performing the planarization treatment on the initial isolation structure may include a wet etching process. In another embodiment, the process of performing the planarization treatment on the initial isolation structure may include a dry etching process, or a chemical mechanical polishing process (CMP).

In one embodiment, the isolation structure 202 may be made of silicon oxide. In another embodiment, the isolation structure may be made of silicon nitride, or silicon oxynitride.

Figure 5:
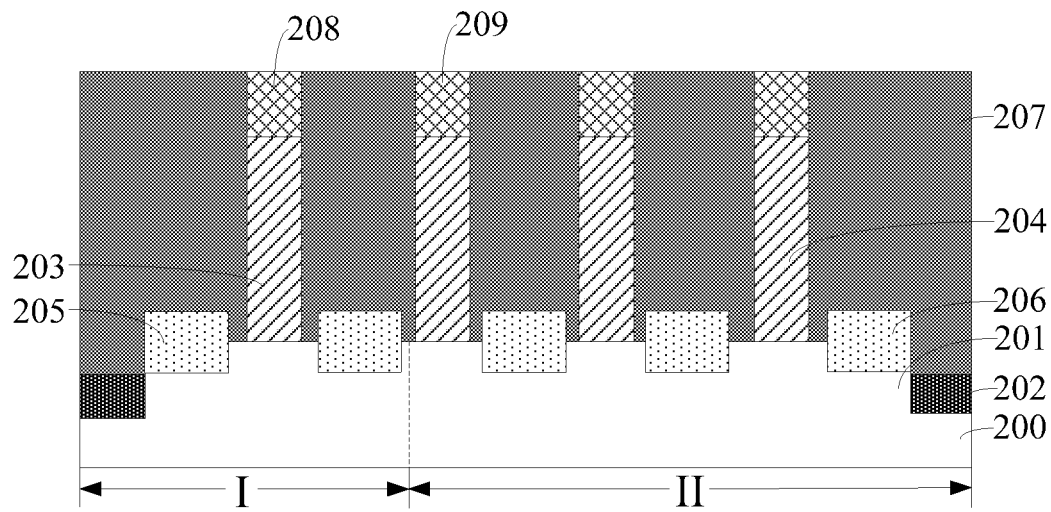

Returning to FIG. 14, after forming the isolation structure, a first gate structure, a first source-drain doped layer, a second gate structure, a second source-drain doped layer, and a first dielectric layer may be formed (S103). FIG. 5 illustrates a corresponding semiconductor structure.

Referring to FIG. 5, a first gate structure 203 and a first source-drain doped layer 205 may be formed. The first gate structure 203 may be formed over the first region I, and the first source-drain doped layers 205 may be formed in the first region I of the substrate on both sides of the first gate structure 203, respectively.

In one embodiment, while forming the first gate structure 203, a plurality of second gate structures 204 may be formed. The second gate structures 204 may be formed over the second region II. While forming the first source-drain doped layer 205, a plurality of second source-drain doped layers 206 may be formed. The second source-drain doped layers 206 may be formed in the second region II on both sides of the second gate structure 204, respectively.

In one embodiment, a first dielectric layer 207 may be formed over the isolation structure 202, and the first dielectric layer 207 may cover the first gate structure 203, the second gate structure 204, the first source-drain doped layer 205, and the second source-drain doped layer 206.

In one embodiment, the first gate structure 203 and the second gate structure 204 may be formed over the isolation structure 202. The first gate structure 203 may be across a length portion of the fin 201, and may cover a portion of sidewall and top surfaces of the fin 201. The second gate structure 204 may be across a length portion of the fin 201, and may cover a portion of sidewall and top surfaces of the fin 201.

In one embodiment, forming the first dielectric layer 207, the first gate structure 203, the second gate structure 204, the first source-drain doped layer 205, and the second source-drain doped layer 206 may include: forming a first dummy gate structure and a second dummy gate structure (not illustrated) over the substrate; etching the fin 201 using the first dummy gate structure as a mask, to form a first source-drain opening (not illustrated) in the fin 201; etching the fin 201 using the second dummy gate structure as a mask, to form a second source-drain opening (not illustrated) in the fin 201; forming the first source-drain doped layer 205 in the first source-drain opening; forming the second source-drain doped layer 206 in the second source-drain opening; forming an initial first dielectric layer over the isolation structure, where the initial first dielectric layer may cover the first dummy gate structure, the second dummy gate structure, the first source-drain doped layer 205 and the second source-drain doped layer 206; performing a planarization treatment on the initial first dielectric layer until the top surfaces of the first dummy gate structure and the second dummy gate structure are exposed, to form the first dielectric layer 207; removing the first dummy gate structure and the second dummy gate structure, to form a first dummy gate opening and a second dummy gate opening (not illustrated) in the first dielectric layer 207; forming the first gate structure 203 in the first dummy gate opening; and forming the second gate structure 204 in the second dummy gate opening.

In one embodiment, the first gate structure 203 may include a first gate dielectric layer and a first gate electrode layer formed over the first gate dielectric layer. In one embodiment, the first gate dielectric layer may be made of a material including a high-K dielectric material. The first gate electrode layer may be made of a material including a metal such as tungsten, aluminum, copper, titanium, silver, gold, lead, or nickel. In one embodiment, the first gate electrode layer may be made of tungsten.

In one embodiment, the second gate structure 204 may include a second gate dielectric layer and a second gate electrode layer formed over the second gate dielectric layer. In one embodiment, the second gate dielectric layer may be made of a material including a high-K dielectric material. The second gate electrode layer may be made of a material including a metal such as tungsten, aluminum, copper, titanium, silver, gold, lead, or nickel. In one embodiment, the second gate electrode layer may be made of tungsten.

In one embodiment, the first dielectric layer 207 may be made of silicon oxide. In another embodiment, the first dielectric layer may be made of a low-K dielectric material (low-K dielectric material refers to a dielectric material with a relative dielectric constant less than 3.9) or ultra-low-K dielectric materials (ultra-low-K dielectric material refers to a dielectric material with a relative dielectric constant less than 2.5).

In one embodiment, after forming the first gate structure 203 and the second gate structure 204, a third protection layer 208 may be formed on the first gate structure 203, and a first protection layer 209 may be formed on the second gate structure 204. In one embodiment, the first dielectric layer 207 may expose top surfaces of the first protection layer 209 and the third protection layer 208.

Forming the third protection layer 208 and the first protection layer 209 may include: back-etching the first gate structure 203 and the second gate structure 204, to form a first gate groove (not illustrated) on the first gate structure 203 and a second gate groove (not illustrated) on the second gate structure 204; and forming the third protection layer 208 in the first gate groove and the first protection layer 209 in the second gate groove. In one embodiment, the third protection layer 208 may be made of silicon nitride, and the first protection layer 209 may be made of silicon nitride.

After forming the first protection layer 209 and the third protection layer 208, the method may further include: forming a first conductive structure over the first source-drain doped layer 205, where the first conductive structure may also be formed on the surface of the first gate structure 203, and a top surface of the first conductive structure may be lower than the top surface of the first protection layer 209; and forming an isolation layer over the first conductive structure. The detailed formation process may refer to FIGS. 6-10.

Figure 6:
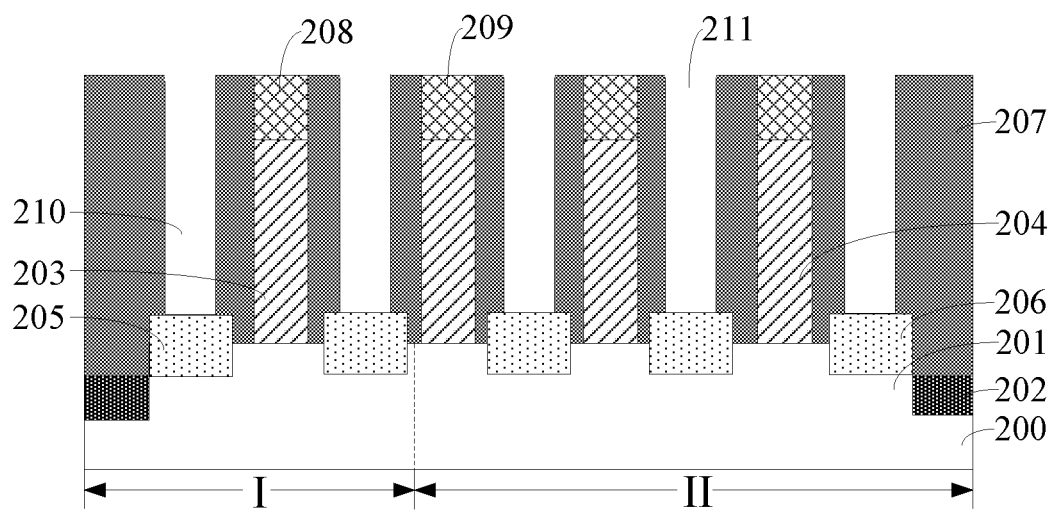

Returning to FIG. 14, after forming the first protection layer and the third protection layer, a first source-drain conductive opening and a second source-drain conductive opening may be formed in the first dielectric layer (S104). FIG. 6 illustrates a corresponding semiconductor structure.

Referring to FIG. 6, a first source-drain conductive opening 210 may be formed in the first dielectric layer 207, where the first source-drain conductive opening 210 may expose the top surface of the first source-drain doped layer 205. A second source-drain conductive opening 211 may formed in the first dielectric layer 207, where the second source-drain conductive opening 211 may expose the top surface of the second source-drain doped layer 206. In one embodiment, the first source-drain conductive opening 210 and the second source-drain conductive opening 211 may be simultaneously formed.

Figure 7:
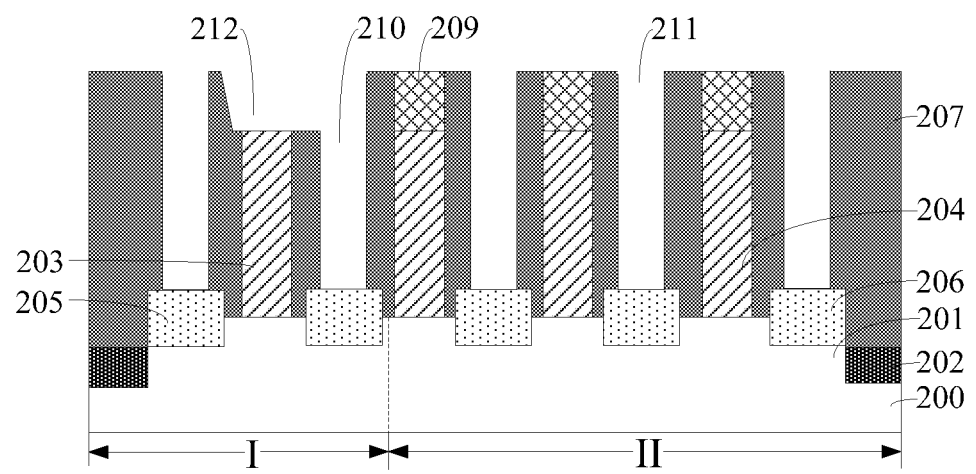

Returning to FIG. 14, after forming the first source-drain conductive opening and the second source-drain conductive opening, a first gate conductive opening may be formed over the first gate structure (S105). FIG. 7 illustrates a corresponding semiconductor structure.

Referring to FIG. 7, a first gate conductive opening 212 may be formed over the first gate structure 203 by removing the third protection layer 208. In one embodiment, the first gate conductive opening 212 may be connected to a portion of the first source-drain conductive opening 210.

Figure 8:
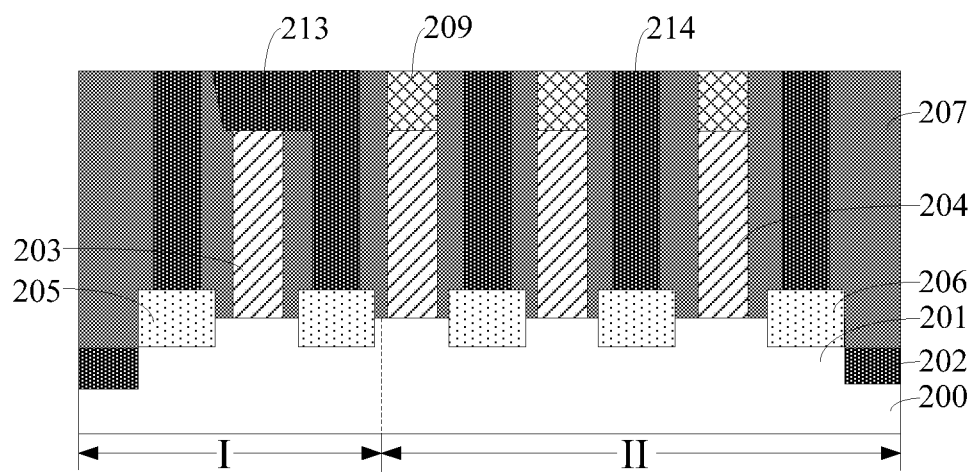

Returning to FIG. 14, after forming the first gate conductive opening, an initial first conductive structure may be formed in the first gate conductive opening and the first source-drain conductive opening, and an initial second conductive structure may be formed in the second source-drain conductive opening (S106). FIG. 8 illustrates a corresponding semiconductor structure.

Referring to FIG. 8, an initial first conductive structure 213 may be formed in the first gate conductive opening 212 and the first source-drain conductive opening 210; and an initial second conductive structure 214 may be formed in the second source-drain conductive opening 211.

In one embodiment, forming the initial first conductive structure 213 and the initial second conductive structure 214 may include: forming a conductive material layer (not illustrated) in the first gate conductive opening 212, the first source-drain conductive opening 210, and the second source-drain conductive opening 211 and on the first dielectric layer 207 and the first protection layer 209; and planarizing the conductive material layer until the top surfaces of the first dielectric layer 207 and the first protection layer 209 are exposed, to form the initial first conductive structure 213 and the initial second conductive structure 214.

Figure 9:
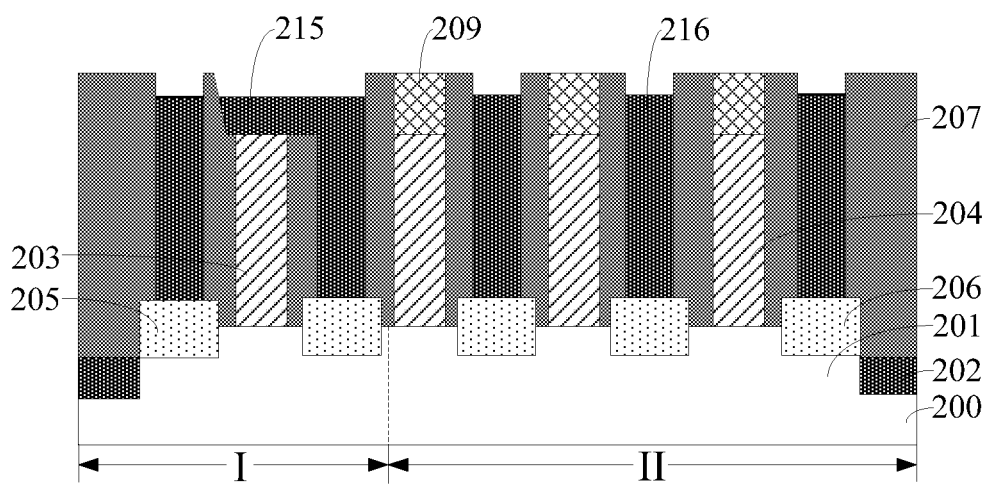

Returning to FIG. 14, after forming the initial first conductive structure and the initial second conductive structure, a first conductive structure and a second conductive structure may be formed (S107). FIG. 9 illustrates a corresponding semiconductor structure.

Referring to FIG. 9, the initial first conductive structure 213 may be back-etched to form a first conductive structure 215. A top surface of the first conductive structure 215 may be lower than the top surface of the first protection layer 209. While back-etching the initial first conductive structure 213, the initial second conductive structure 214 may be back-etched to form the second conductive structure 216. A top surface of the second conductive structure 216 may be lower than the top surface of the first protection layer 209.

The first source-drain conductive opening 210 and the first gate conductive opening 212 may be first formed. After forming the first gate conductive opening 212 and the first source-drain conductive opening 210, the first conductive structure 215 may be formed in the first source-drain conductive opening 210 and the first gate conductive opening 212. Through such process, the first conductive structure 215 may be simultaneously formed over the first gate structure 203 and the first source-drain doped layer 205, which may effectively reduce the process steps and improve the production efficiency.

The first conductive structure 215 may be made of a material including a metal, and the metal may include tungsten, aluminum, copper, titanium, silver, gold, lead, or nickel. In one embodiment, the first conductive structure 215 may be made of tungsten.

The second conductive structure 216 may be made of a material including a metal, and the metal may include tungsten, aluminum, copper, titanium, silver, gold, lead, or nickel. In one embodiment, the second conductive structure 216 may be made of tungsten.

Figure 10:
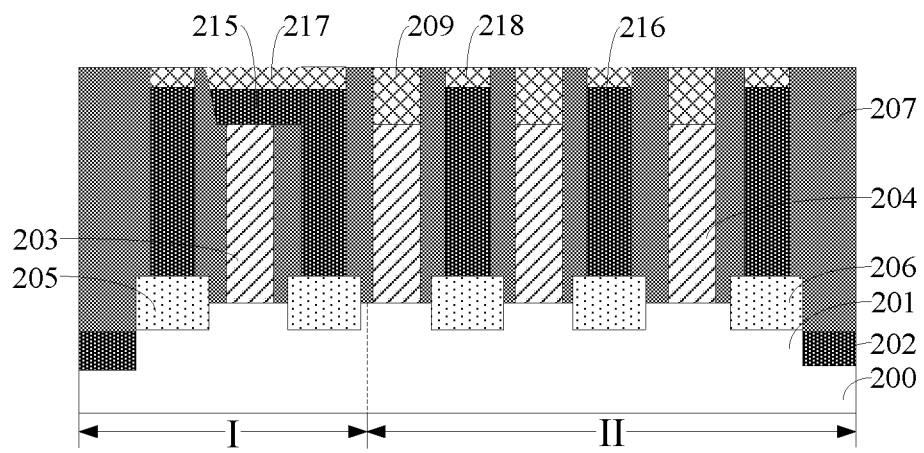

Returning to FIG. 14, after forming the first conductive structure and the second conductive structure, an isolation layer may be formed over the first conductive structure, and a second protection layer may be formed over the second conductive structure (S108). FIG. 10 illustrates a corresponding semiconductor structure.

Referring to FIG. 10, an isolation layer 217 may be formed over the first conductive structure 215. While forming the isolation layer 217 over the first conductive structure 215, a second protection layer 218 may be formed over the second conductive structure 216.

The isolation layer 217 may be formed over the first conductive structure 215. The isolation layer 217 may be configured to effectively reduce the short-circuit between the first conductive structure 215 and any other device structure, thereby improving the electrical performance of ultimately formed semiconductor structure.

In addition, the top surface of the first conductive structure 215 may be lower than the top surface of the first protection layer 209, such that a certain height difference may be formed between the first conductive structure 215 and subsequently formed gate plug or source-drain plug, and the spacing between the first conductive structure 215 and the gate plug or the source-drain plug may increase, thereby reducing the parasitic capacitance generated between the first conductive structure 215 and the gate plug or the source-drain plug.

In one embodiment, the first dielectric layer 207 may expose the top surfaces of the isolation layer 217 and the second protection layer 218. In one embodiment, the isolation layer 217 may be made of silicon nitride. The second protection layer 218 may be made of silicon nitride.

Figure 11:
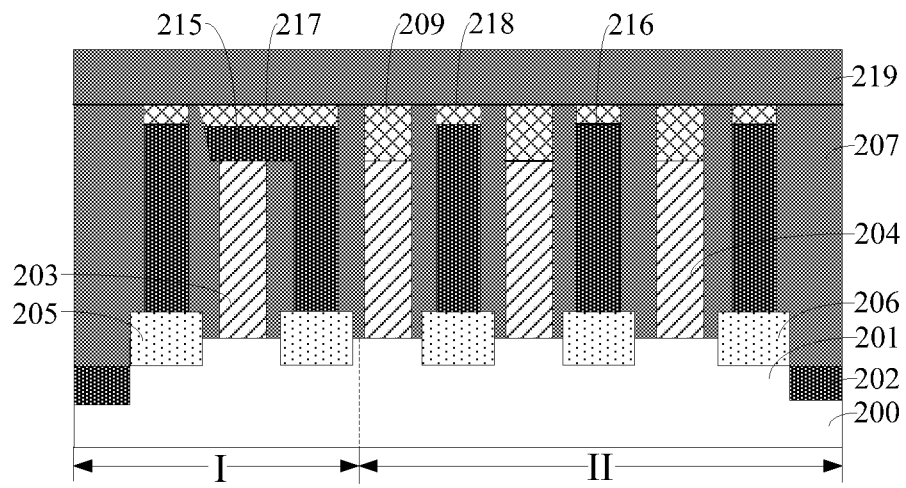

Returning to FIG. 14, after forming the isolation layer and the second protection layer, a second dielectric layer may be formed over the first dielectric layer, the isolation layer, the first protection layer, and the second protection layer (S109). FIG. 11 illustrates a corresponding semiconductor structure.

Referring to FIG. 11, after forming the isolation layer 217, a second dielectric layer 219 may be formed over the first dielectric layer 207, the isolation layer 217, the first protection layer 209, and the second protection layer 218.

In one embodiment, the second dielectric layer 219 may be made of silicon oxide. In another embodiment, the second dielectric layer 219 may be made of a low-k dielectric material (low-K dielectric material may refer to a dielectric material with a relative dielectric constant less than 3.9), or ultra-low-K dielectric materials (ultra-low-K dielectric material may refer to a dielectric material with a relative dielectric constant less than 2.5).

After forming the second dielectric layer 219, the method may further include: forming a source-drain plug and a gate plug in the second dielectric layer 219. The second dielectric layer 219 may expose top surfaces of the source-drain plug and the gate plug. The source-drain plug may be extended in to an inside of the first dielectric layer 207, and the source-drain plug may be in contact with a portion of the second conductive structure 216. The gate plug may be extended in to an inside of the first dielectric layer 207, and the gate plug may be in contact with a portion of the second gate structure 204. For illustrative purposes, the specific formation process of the source-drain plug and the gate plug may refer to FIGS. 12-13.

Returning to FIG. 14, after forming the second dielectric layer, a first source-drain plug opening, a second source-drain plug opening, a first gate plug opening, and a second gate plug opening may be formed (S110). FIG. 12 illustrates a corresponding semiconductor structure.

Referring to FIG. 12, a first patterned layer (not illustrated) may be formed over the second dielectric layer 219, and the first patterned layer may expose a portion of the top surface of the second dielectric layer 219. The second dielectric layer 219 may be etched using the first patterned layer as a mask, to form a first source-drain plug opening 220 and a first gate plug opening 221 in the second dielectric layer 219. The first source-drain plug opening 220 may expose a portion of the top surface of the second protection layer 218, and the first gate plug opening 221 may expose a portion of the top surface of the first protection layer 209. The portion of the second protection layer 218 exposed by the first source-drain plug opening 220 may be etched until the top surface of the second conductive structure 216 is exposed, to form a second source-drain plug opening 222 in the first dielectric layer 207. The portion of the first protection layer 209 exposed by the first gate plug opening 221 may be etched until the top surface of the second gate structure 204 is exposed, to form a second gate plug opening 223 in the first dielectric layer 207. After forming the second source-drain plug opening 222 and the second gate plug opening 223, the first patterned layer may be removed.

In one embodiment, the first patterned layer may be made of a material including photoresist. Forming the first patterned layer may include a photolithography patterning process. Removing the first patterned layer may include an ashing process, and gas of the ashing process may include an oxygen-containing gas, e.g., oxygen or ozone.

Returning to FIG. 14, after forming the second source-drain plug opening and the second gate plug opening, a source-drain plug may be formed in the first source-drain plug opening and the second source-drain plug opening, and a gate plug may be formed in the first gate plug opening and the second gate plug opening (S111). FIG. 13 illustrates a corresponding semiconductor structure.

Referring to FIG. 13, a source-drain plug 224 may be formed in the first source-drain plug opening 220 and the second source-drain plug opening 222, and a gate plug 225 may be formed in the first gate plug opening 221 and the second gate plug opening 223.

In one embodiment, the source-drain plug 224 and the gate plug 225 may be simultaneously formed. In one embodiment, the source-drain plug 224 may be made of a material including a metal, and the metal may include tungsten. In one embodiment, the gate plug 225 may be made of a material including a metal, and the metal may include tungsten.

Correspondingly, the present disclosure also provides a semiconductor structure. Referring to FIG. 13, the semiconductor structure may include a substrate including a first region I and a second region II adjacent to the first region I, and a first gate structure 203 and a first source-drain doped layer 205. The first gate structure 203 may be formed over the first region I, and the first source-drain doped layers 205 may be formed in the first region I of the substrate on both sides of the first gate structure 203, respectively. The semiconductor structure may also include a plurality of second gate structures 204 and a plurality of second source-drain doped layers 206. The second gate structure 204 may be formed over the second region II, and the second source-drain doped layers 206 may be formed in the second region II on both sides of the second gate structure 204, respectively. In addition, the semiconductor structure may include a first protection layer 209 formed over the second gate structure 204, and a first conductive structure 215 formed over the first source-drain doped layer 205. The first conductive structure 215 may also be formed on the surface of the first gate structure 203, and a top surface of the first conductive structure 215 may be lower than a top surface of the first protection layer 209. Further, the semiconductor structure may include an isolation layer 217 formed on the first conductive structure 215.

The isolation layer 217 may be formed over the first conductive structure 215, and the isolation layer 217 may be configured to effectively reduce the short-circuit between the first conductive structure 215 and any other device structure, thereby improving the electrical performance of ultimately formed semiconductor structure. In addition, the top surface of the first conductive structure 215 may be lower than the top surface of the first protection layer 209, such that a certain height difference may be formed between the first conductive structure 215 and subsequently formed gate plug or source-drain plug, and the spacing between the first conductive structure 215 and the gate plug or the source-drain plug may increase, thereby reducing the parasitic capacitance generated between the first conductive structure 215 and the gate plug or the source-drain plug.

In one embodiment, the semiconductor structure may further include a first dielectric layer 207 formed over the substrate. The first dielectric layer 207 may cover the first gate structure 203, the second gate structure 204, the first source-drain doped layer 205, the second source-drain doped layer 206, the first protection layer 209, the first conductive structure 215 and the isolation layer 217. The first dielectric layer 207 may expose the top surfaces of the isolation layer 217 and the first protection layer 209.

In one embodiment, the semiconductor structure may further include a second conductive structure 216 formed over the second source-drain doped layer 206, and a second protection layer 218 formed over the second conductive structure 216. A top surface of the second conductive structure 216 may be lower than the top surface of the first protection layer 209. The first dielectric layer 207 may expose a top surface of the second protection layer 218.

In one embodiment, the semiconductor structure may further include a second dielectric layer 219 formed over the first dielectric layer 207, the isolation layer 217, the first protection layer 209, and the second protection layer 218.

In one embodiment, the semiconductor structure may further include a source-drain plug 224 and a gate plug 225 formed in the second dielectric layer 219. The second dielectric layer 219 may expose the top surfaces of the source-drain plug 224 and the gate plug 225. The source-drain plug 224 may be extended in to an inside of the first dielectric layer 207, and may be in contact with a portion of the second conductive structure 216. The gate plug 225 may be extended in to an inside of the first dielectric layer 207, and may be in contact with a portion of the second gate structure 204.

In one embodiment, the substrate may include a base 200 and a plurality of discrete fins 201 on the base 200. The first gate structure 203 may be across a length portion of the fin 201, and may cover a portion of sidewall and top surfaces of the fin 201. The second gate structure 204 may be across a length portion of the fin 201, and may cover a portion of sidewall and top surfaces of the fin 201.

In one embodiment, the first source-drain doped layer 205 may be formed in the fin 201, and the second source-drain doped layer 206 may be formed in the fin 201.

In one embodiment, the first gate structure 203 may include a first gate dielectric layer and a first gate electrode layer formed over the first gate dielectric layer. The second gate structure 204 may include a second gate dielectric layer and a second gate electrode layer formed over the second gate dielectric layer.

In one embodiment, the isolation layer 217 may be made of a material including silicon nitride. The first conductive structure 215 may be made of a material including a metal, and the metal may include tungsten, aluminum, copper, titanium, silver, gold, lead, or nickel. In one embodiment, the first conductive structure 215 may be made of tungsten. The second conductive structure 216 may be made of a material including a metal, and the metal may include tungsten, aluminum, copper, titanium, silver, gold, lead, or nickel. In one embodiment, the second conductive structure 216 may be made of tungsten.

The disclosed embodiments may have following beneficial effects. In the disclosed embodiments of the present disclosure, the isolation layer may be formed over the first conductive structure. The isolation layer may be configured to effectively reduce the short-circuit between the first conductive structure and any other device structure, thereby improving the electrical performance of ultimately formed semiconductor structure.

In addition, the top surface of the first conductive structure may be lower than the top surface of the first protection layer, such that a certain height difference may be formed between the first conductive structure and subsequently formed gate plug or source-drain plug, and the spacing between the first conductive structure and the gate plug or the source-drain plug may increase, thereby reducing the parasitic capacitance generated between the first conductive structure and the gate plug or the source-drain plug.

Further, the first source-drain conductive opening and the first gate conductive opening may be first formed. After forming the first gate conductive opening and the first source-drain conductive opening, the first conductive structure may be formed in the first source-drain conductive opening and the first gate conductive opening. Through such process, the first conductive structure may be simultaneously formed over the first gate structure and the first source-drain doped layer, which may effectively reduce the process steps and improve the production efficiency.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   a substrate, wherein the substrate includes a first region and a second region adjacent to the first region;
   a first gate structure and first source-drain doped layers, wherein the first gate structure is formed over the first region, and the first source-drain doped layers are formed in the first region of the substrate on both sides of the first gate structure, respectively;
   a second gate structure and second source-drain doped layers, wherein the second gate structure is formed over the second region, and the second source-drain doped layers are formed in the second region of the substrate on both sides of the second gate structure, respectively;
   a first protection layer, formed over the second gate structure;
   a first conductive structure, formed over a first source-drain doped layer of the source-drain doped layers, wherein the first conductive structure is also formed on the first gate structure, and a top surface of the first conductive structure is lower than a top surface of the first protection layer;
   an isolation layer, formed over the first conductive structure; and
   a first dielectric layer formed over the substrate, wherein the first dielectric layer covers the first gate structure, the second gate structure, the first source-drain doped layers, the second source-drain doped layers, the first protection layer, the first conductive structure, and the isolation layer, and the first dielectric layer exposes top surfaces of the isolation layer and the first protection layer.

2. The semiconductor structure according to claim 1, further including:
   a second conductive structure, formed over a second source-drain doped layer of the second source-drain doped layers, wherein a top surface of the second conductive structure is lower than the top surface of the first protection layer; and
   a second protection layer, formed over the second conductive structure, wherein the first dielectric layer exposes a top surface of the second protection layer.

3. The semiconductor structure according to claim 2, further including:
   a second dielectric layer, formed over the first dielectric layer, the isolation layer, the first protection layer, and the second protection layer.

4. The semiconductor structure according to claim 3, further including:
   a source-drain plug and a gate plug in the second dielectric layer, wherein:
   the second dielectric layer exposes top surfaces of the source-drain plug and the gate plug,
   the source-drain plug is extended into an inside of the first dielectric layer, and is in contact with a portion of the second conductive structure, and
   the gate plug is extended into an inside of the first dielectric layer, and is in contact with a portion of the second gate structure.

5. The semiconductor structure according to claim 2, wherein:
   the second conductive structure is made of a material including a metal, and the metal includes tungsten, aluminum, copper, titanium, silver, gold, lead, nickel, or a combination thereof.

6. The semiconductor structure according to claim 1, wherein:
   the substrate includes a base and a plurality of discrete fins formed on the base;
   the first gate structure is across a length portion of a fin of the plurality of discrete fins, and covers a portion of sidewall and top surfaces of the fin; and
   the second gate structure is across a length portion of the fin, and covers a portion of sidewall and top surfaces of the fin.

7. The semiconductor structure according to claim 6, wherein:
   the first source-drain doped layers are formed in the fin, and
   the second source-drain doped layers are formed in the fin.

8. The semiconductor structure according to claim 1, wherein:
   the first gate structure includes a first gate dielectric layer and a first gate electrode layer formed over the first gate dielectric layer; and
   the second gate structure includes a second gate dielectric layer and a second gate electrode layer formed over the second gate dielectric layer.

9. The semiconductor structure according to claim 1, wherein:
   the isolation layer is made of a material including silicon nitride.

10. The semiconductor structure according to claim 1, wherein:
    the first conductive structure is made of a material including a metal, and the metal includes tungsten, aluminum, copper, titanium, silver, gold, lead, nickel, or a combination thereof.

11. A method for forming a semiconductor structure, comprising:

providing a substrate, wherein the substrate includes a first region and a second region adjacent to the first region;

forming a first gate structure and first source-drain doped layers, wherein the first gate structure is formed over the first region, and the first source-drain doped layers are formed in the first region of the substrate on both sides of the first gate structure, respectively;

forming a second gate structure and second source-drain doped layers, wherein the second gate structure is formed over the second region, and the second source-drain doped layers are formed in the second region of the substrate on both sides of the second gate structure, respectively;

forming a first protection layer over the second gate structure;

forming a first conductive structure over a first source-drain doped layer of the first source-drain doped layers, wherein the first conductive structure is also formed on the first gate structure, and a top surface of the first conductive structure is lower than a top surface of the first protection layer;

forming an isolation layer over the first conductive structure; and forming a first dielectric layer over the substrate, wherein the first dielectric layer covers the first gate structure, the second gate structure, the first source-drain doped layers, the second source-drain doped layers, the first protection layer, the first conductive structure, and the isolation layer, and the first dielectric layer exposes top surfaces of the isolation layer and the first protection layer.

12. The method according to claim 11, before forming the first conductive structure, further including:
forming a third protection layer over the first gate structure.

13. The method according to claim 12, wherein forming the first dielectric layer, the first gate structure, the second gate structure, the first protection layer, and the third protection layer includes:
forming a first dummy gate structure and a second dummy gate structure over the substrate;
forming the first dielectric layer over the substrate, wherein the first dielectric layer covers the first dummy gate structure and the second dummy gate structure, and exposes top surfaces of the first dummy gate structure and the second dummy gate structure;
removing the first dummy gate structure and the second dummy gate structure, to form a first dummy gate opening and a second dummy gate opening in the first dielectric layer;
forming the first gate structure in the first dummy gate opening;

forming the second gate structure in the second dummy gate opening;
back-etching the first gate structure and the second gate structure, to form a first gate groove on the first gate structure and a second gate groove on the second gate structure; and
forming the third protection layer in the first gate groove and the first protection layer in the second gate groove.

14. The method according to claim 12, wherein forming the first conductive structure and the isolation layer includes:
forming a first source-drain conductive opening in the first dielectric layer, wherein the first source-drain conductive opening exposes a top surface of the first source-drain doped layer;
forming a first gate conductive opening over the first gate structure by removing the third protection layer;
forming an initial first conductive structure in the first gate conductive opening and the first source-drain conductive opening;
forming the first conductive structure by back-etching the initial first conductive structure; and
forming the isolation layer over the first conductive structure.

15. The method according to claim 14, further including:
forming a second conductive structure over a second source-drain doped layer of the second source-drain doped layers, wherein a top surface of the second conductive structure is lower than the top surface of the first protection layer; and
forming a second protection layer over the second conductive structure, wherein the first dielectric layer exposes a top surface of the second protection layer.

16. The method according to claim 15, wherein:
the first conductive structure and the second conductive structure are simultaneously formed.

17. The method according to claim 15, further including:
forming a second dielectric layer over the first dielectric layer, the isolation layer, the first protection layer, and the second protection layer.

18. The method according to claim 17, further including:
forming a source-drain plug and a gate plug in the second dielectric layer, wherein:
the second dielectric layer exposes top surfaces of the source-drain plug and the gate plug,
the source-drain plug is extended into an inside of the first dielectric layer, and is in contact with a portion of the second conductive structure, and
the gate plug is extended into an inside of the first dielectric layer, and is in contact with a portion of the second gate structure.

* * * * *